(12) United States Patent
Chuang et al.

(10) Patent No.: US 12,615,782 B2
(45) Date of Patent: Apr. 28, 2026

(54) SEMICONDUCTOR STRUCTURE AND SEMICONDUCTOR DEVICE

(71) Applicant: CHANGXIN MEMORY TECHNOLOGIES, INC., Hefei (CN)

(72) Inventors: Ling-Yi Chuang, Hefei (CN); Kaimin Lv, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 609 days.

(21) Appl. No.: 18/166,752

(22) Filed: Feb. 9, 2023

(65) Prior Publication Data

US 2024/0057352 A1     Feb. 15, 2024

(30) Foreign Application Priority Data

Aug. 10, 2022     (CN) .......................... 202210956506.4

(51) Int. Cl.
H01L 23/00          (2006.01)
H10B 80/00          (2023.01)
(Continued)

(52) U.S. Cl.
CPC ............ H10B 80/00 (2023.02); H10W 20/20 (2026.01); H10W 70/65 (2026.01);
(Continued)

(58) Field of Classification Search
CPC .......... H10B 80/00; H01L 2224/02381; H01L 2224/0557; H01L 2224/06181;
(Continued)

(56) References Cited

U.S. PATENT DOCUMENTS 8,390,109 B2     3/2013   Popovic
10,229,900 B2    3/2019   Kim et al.
(Continued)

FOREIGN PATENT DOCUMENTS

CN        106847712 A      6/2017
CN        108155174 A      6/2018
(Continued)

OTHER PUBLICATIONS

US office action in U.S. Appl. No. 18/155,721, mailed on Sep. 22, 2025.

*Primary Examiner* — Jessica S Manno
*Assistant Examiner* — Sandra Milena Rodriguez Villanu
(74) *Attorney, Agent, or Firm* — Syncoda LLC; Feng Ma

(57)          ABSTRACT

A semiconductor structure and semiconductor device are provided. The semiconductor structure includes a plurality of layers of memory modules stacked on an upper surface of the logic chip in a first direction which is perpendicular to the upper surface of the logic chip. Each storage module includes a plurality of memory chips stacked in a second direction which is parallel to the upper surface. Each memory chip in a top layer includes one second wireless communication part; and each memory chip in a non-top layer includes two second wireless communication parts arranged in the first direction and a wired communication part connected between the two second wireless communication parts. Two adjacent second wireless communication parts located on different memory chips in the first direction communicate with each other wirelessly; and each first wireless communication part communicates wirelessly with a closest second wireless communication part in a bottom memory chip.

19 Claims, 17 Drawing Sheets

(51) Int. Cl.
| | |
|---|---|
| *H10W 20/20* | (2026.01) |
| *H10W 70/65* | (2026.01) |
| *H10W 70/652* | (2026.01) |
| *H10W 70/654* | (2026.01) |
| *H10W 72/20* | (2026.01) |
| *H10W 72/90* | (2026.01) |
| *H10W 74/15* | (2026.01) |
| *H10W 90/00* | (2026.01) |

(52) U.S. Cl.
CPC ........ *H10W 70/652* (2026.01); *H10W 70/654* (2026.01); *H10W 72/244* (2026.01); *H10W 72/248* (2026.01); *H10W 72/942* (2026.01); *H10W 72/944* (2026.01); *H10W 74/15* (2026.01); *H10W 90/722* (2026.01); *H10W 90/723* (2026.01); *H10W 90/732* (2026.01); *H10W 90/792* (2026.01)

(58) Field of Classification Search
CPC . H01L 2224/08145; H01L 2224/13024; H01L 2224/14181; H01L 2224/16137; H01L 2224/16145; H01L 2224/32145; H01L 2224/73204; H01L 2924/1431; H01L 2924/1436; H01L 2924/1437; H01L 25/0652; H01L 25/0657; H01L 2225/06541; H01L 25/18; G11C 5/025; G11C 5/06; H04B 10/116
See application file for complete search history.

(56) References Cited

U.S. PATENT DOCUMENTS

| | | | |
|---|---|---|---|
| 10,811,386 | B2 | 10/2020 | Chiu |
| 11,183,484 | B2 | 11/2021 | Okutsu et al. |
| 2002/0084458 | A1 | 7/2002 | Halbert |
| 2012/0211878 | A1 | 8/2012 | Popovic |
| 2018/0040587 | A1 | 2/2018 | Tao et al. |
| 2018/0114777 | A1 | 4/2018 | Chiu et al. |
| 2018/0158809 | A1 | 6/2018 | Kim et al. |
| 2018/0277516 | A1 | 9/2018 | Kume |
| 2021/0143129 | A1 | 5/2021 | Okutsu et al. |
| 2021/0242037 | A1 | 8/2021 | Wu |
| 2024/0038726 | A1* | 2/2024 | Obata .................. H01L 23/481 |

FOREIGN PATENT DOCUMENTS

| | | |
|---|---|---|
| CN | 113056819 A | 6/2021 |
| CN | 114664671 A | 6/2022 |
| JP | 2008235577 A | 10/2008 |
| TW | 200608526 A | 3/2006 |
| WO | 8904113 A1 | 5/1989 |

* cited by examiner 500
400
200
300

SEMICONDUCTOR STRUCTURE AND SEMICONDUCTOR DEVICE

CROSS REFERENCE TO RELATED APPLICATION

The present application is based on and claims priority from Chinese Patent Application No. 202210956506.4, filed on Aug. 10, 2022, the disclosure of which is hereby incorporated by reference in its entirety

BACKGROUND

In order to improve the integration level of semiconductor structure, one or more memory chips may be disposed in the same package structure. High Bandwidth Memory (HBM) is a new type of memory. Memory chip stacking technology, represented by HBM, extends the memory layout from the original one-dimensional to three-dimensional. That is, many memory chips are stacked together and packaged, and thus greatly improving the density of memory chips and implementing large capacity and high bandwidth.

However, with the increase of the number of stacked layers, the performance of HBM is affected. That is, it is difficult to balance the capacity density and performance of semiconductor structure.

SUMMARY

Embodiments of the present disclosure provide a semiconductor structure and a semiconductor device, which is capable of at least simultaneously improving the capacity density and performance of the semiconductor structure.

According to some embodiments of the present disclosure, an aspect of the embodiments of the present disclosure provides a semiconductor structure. The semiconductor structure includes: a logic chip including first wireless communication parts; and a plurality of layers of memory modules stacked on the upper surface of the logic chip in a first direction, herein the first direction is perpendicular to the upper surface of the logic chip. Each storage module includes a plurality of memory chips stacked in a second direction, and the second direction is parallel to the upper surface of the logic chip. Each memory chip in a top layer includes one second wireless communication part; and each memory chip in a non-top layer includes two second wireless communication parts arranged in the first direction and a wired communication part connected between the two second wireless communication parts. Two adjacent second wireless communication parts located on different memory chips in the first direction communicate with each other wirelessly; and each first wireless communication part communicates wirelessly with a second wireless communication part, which is closest to the respective first wireless communication part, in a bottom memory chip.

According to some embodiments of the present disclosure, another aspect of the embodiments of the present disclosure provides a semiconductor device. The semiconductor device includes: a substrate; a logic chip disposed on the substrate and including first wireless communication parts; and a plurality of layers of memory modules stacked on the upper surface of the logic chip in a first direction, herein the first direction is perpendicular to the upper surface of the logic chip. Each storage module includes a plurality of memory chips stacked in a second direction, and the second direction is parallel to the upper surface of the logic chip. Each memory chip in a top layer includes one second wireless communication part; and each memory chip in a non-top layer includes two second wireless communication parts arranged in the first direction and a wired communication part connected between the two second wireless communication parts. Two adjacent second wireless communication parts located on different memory chips in the first direction communicate with each other wirelessly; and each first wireless communication part communicates wirelessly with a second wireless communication part, which is closest to the first wireless communication part, in a bottom memory chip.

BRIEF DESCRIPTION OF THE DRAWINGS

The drawings herein are incorporated into the specification and constitute a part of the specification, and illustrate embodiments in accordance with the disclosure and are used to explain the principles of the disclosure with the specification. It is apparent that the drawings of the following description are merely some embodiments of the disclosure. For a person of ordinary skilled in the art, other drawings may be obtained based on these drawings without involving any inventive effort.

DETAILED DESCRIPTION

Figure 1:
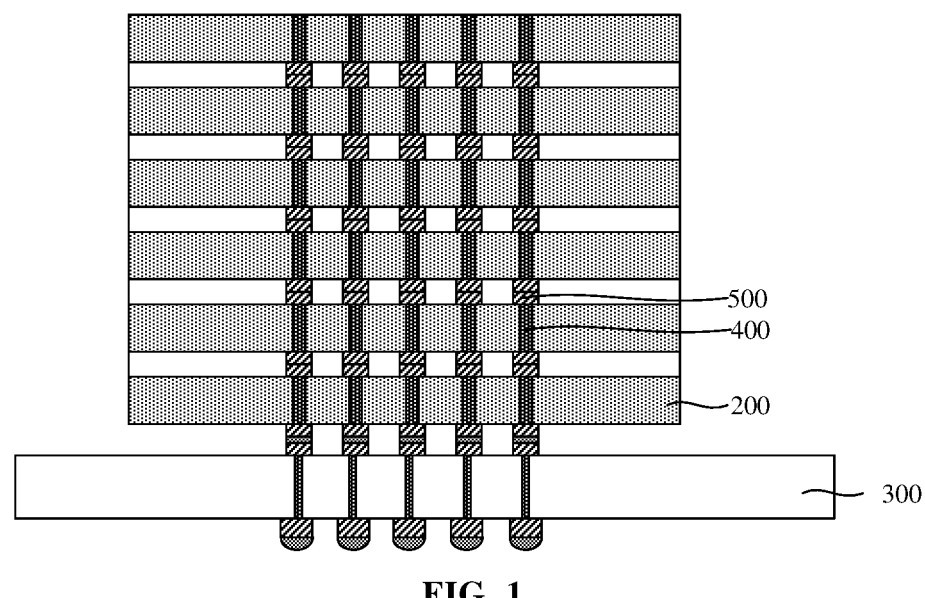
FIG. 1 illustrates a schematic diagram of a semiconductor structure.

As can be seen from the background, it is difficult to balance the capacity density and performance of the semiconductor structure. Referring to FIG. 1, it is found through analysis that the main reason lies in that the arrangement direction of a plurality of memory chips 200 is perpendicular to the upper surface of the logic chip 300, and the conductive vias 400 and the bonding parts 500 of a plurality of memory chips 200 are electrically connected, thereby constituting a wired communication path. When the number of stacking layers is large, the communication distance between the uppermost memory chip 200 and the logic chip 300 and the communication distance between the lowermost memory chip 200 and the logic chip 300 are quite different, resulting in a large difference in communication delay between different memory chips 200 and the logic chip 300, thus affecting the operation rate of the product.

An embodiment of the present disclosure provides a semiconductor structure. The semiconductor structure includes: a plurality of layers of memory modules stacked in a direction perpendicular to an upper surface of a logic chip. Each memory module includes a plurality of memory chips stacked in a direction parallel to the upper surface of the logic chip, that is, a plurality of memory chips in the memory module are arranged in a direction parallel to the upper surface of the logic chip. Therefore, the distances between the memory chips of the same memory module and the logic chip are the same, so as to reduce the difference of communication delay between the same memory module and the logic chip. In addition, a plurality of memory modules can improve the capacity density. In addition, the second wireless communication parts and the wired communication parts in the first direction can form the communication path, the wired communication can reduce signal loss, and the wireless communication omits the step of manufacturing the wired communication part between adjacent memory chips, so as to reduce the process difficulty. Therefore, the semiconductor structure provided by the embodiment of the present disclosure can ensure the performance of the semiconductor structure while improving the capacity density.

The embodiments of the present disclosure will be described in detail below with reference to the accompanying drawings. However, it is to be understood for those ordinary skilled in the art that in each embodiment of the present disclosure, numerous technical details are provided for a reader to better understand the embodiments of the present disclosure. However, even without these technical details and various variations and modifications based on the following embodiments, the technical solutions claimed in the embodiments of the present disclosure may be implemented.

As illustrated in FIG. 2 to FIG. 15, embodiments of the present disclosure provide a semiconductor structure. The semiconductor structure includes: a logic chip 3 including first wireless communication parts 31; and a plurality of layers of memory modules 100 stacked on the upper surface of the logic chip 3 in a first direction X, herein the first direction X is perpendicular to the upper surface of the logic chip 3. Each memory module 100 includes a plurality of memory chips 1 stacked in a second direction Y, and the second direction Y is parallel to the upper surface of the logic chip 3. Each memory chip 1 in a top layer includes one second wireless communication part 11; and each memory chip 1 in a non-top layer includes two second wireless communication parts 11 arranged in the first direction X and a wired communication part 13 connected between the two second wireless communication parts 11. Two adjacent second wireless communication parts 11 located on different memory chips 1 in the first direction X communicate with each other wirelessly; and each of the first wireless communication parts 31 communicates wirelessly with a second wireless communication part 11, which is closest to the first wireless communication part 31, in a bottom memory chip 1.

For convenience of understanding, two second wireless communication parts 11 of each memory chip 1 in the non-top layer are defined as a lower communication part 11b and an upper communication part 11a, respectively. That is, the first wireless communication part 31 performs wireless communication with the lower communication part 11b of the memory chip 1 in the bottom layer, and then the lower communication part 11b transmits data to the upper communication part 11a of the memory chip 1 in the bottom layer through the wired communication part 13. The upper communication part 11a of the bottom memory chip 1 performs wireless communication with the lower communication part 11b of the memory chip 1 in the sub-bottom layer. The memory chips 1 stacked in the first direction X performs communication in such a manner in turn. Therefore, the semiconductor structure can combine the advantages of both wireless communication and wired communication, and can improve the communication quality while eliminating the wired communication parts 13 between adjacent memory chips 1.

For example, when the memory chip 1 in the bottom layer is selected, the first wireless communication part 31 performs wireless communication with the lower communication part 11b of the memory chip 1 in the bottom layer. When the memory chip 1 in the top layer is selected, the first wireless communication part 31 transmits data to the lower communication part 11b of the memory chip 1 in the top layer through the lower communication parts 11b, the wired communication parts 13 and the upper communication parts 11a of the memory chips 1 in the non-top layer in sequence. That is, the lower communication part 11b of the memory chip 1 in the non-top layer may be used both for its own communication and as a communication transfer station of the above memory chips 1. The wired communication part 13 and the upper communication part 11a may be used only as a communication transfer station for the above memory chip 1. In some other embodiments, the wired communication part 13 and the upper communication part 11a are also used for communication for the memory chip 1 in which they are located.

It is to be noted that at the same time, when the logic chip 3 performs chip selection, one of the memory modules 100 is selected to read and write data. Therefore, when the upper layer of memory module 100 and lower layer of memory module 100 are operating, the operations of reading and writing are only performed on one layer of memory chips 1 at the same time. Although the overall communication delay of the upper layer memory module 100 is longer than that of the lower layer memory module 100, the communication delay of all memory chips 1 in the same layer of memory module 100 is not affected.

For example, the bottom layer of memory module 100 may be a primary memory module and the non-bottom layer of memory module 100 may be a secondary memory module. Since the distance between the primary memory module and the logic chip 3 is the closest, it is beneficial to improve the operating rate of the product.

The semiconductor structure will be described in detail below with reference to the accompanying drawings.

The memory chip 1 may be a chip such as Dynamic Random Access Memory (DRAM) or Static Random-Access Memory (SRAM). The memory chip 1 includes an opposite front surface and back surface, and a side surface connected between the front surface and back surface, the area of the front surface and the back surface is larger than the area of the side surface. Two adjacent memory chips 1 may be stacked in a manner of front surface-to-front surface, or front surface-to-back surface, or back surface-to-back surface. In some embodiments, the front surface of the memory chip 1 may also be understood as an active surface 13, and the back surface of the front surface of the memory chip 1 may also be understood as a non-active surface opposite to the active surface 13.

Figure 2:
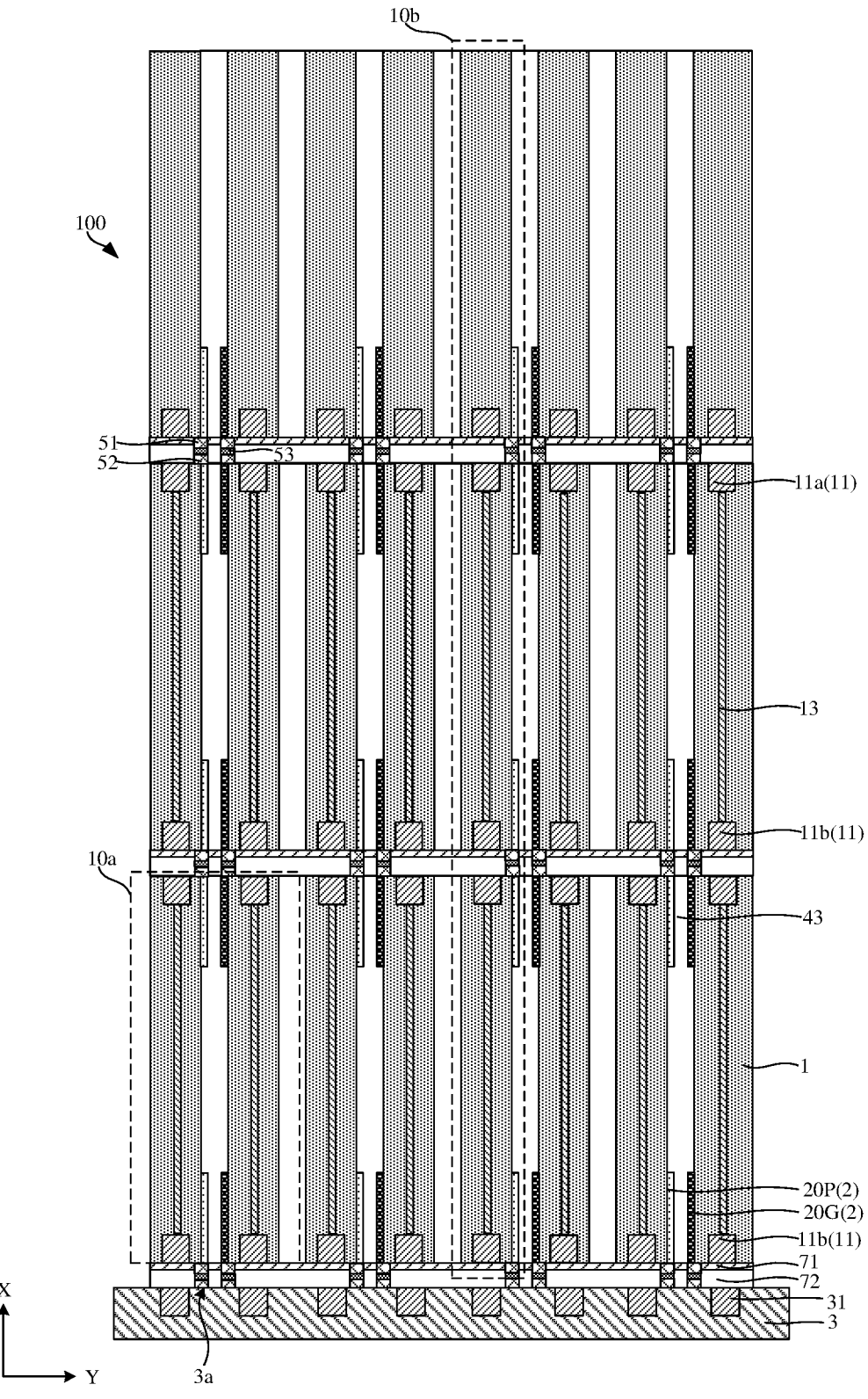
FIG. 2 and FIG. 3 illustrate two schematic cross-section views of a semiconductor structure provided by an embodiment of the present disclosure respectively.

Referring to FIG. 2, the numbers of memory chips 1 of a plurality of memory modules 100 are the same and the memory chips 1 of different memory modules 100 are disposed one-to-one in the first direction X. A plurality of layers of memory modules 100 form a plurality of memory cells 10*b* arranged in the second direction Y, and each memory cell 10*b* includes a plurality of memory chips 1 arranged in the first direction X. That is, the second wireless communication parts 11 and the wired communication parts 13 in the same memory cell 10*b* may form one communication path.

Continuing with reference to FIG. 2, the lengths of a plurality of wired communication parts 13 in the same memory module 100 are the same in the first direction X. In this way, it is advantageous to unify the manufacturing processes of a plurality of wired communication parts 13, and to improve the consistency of communication delays of the memory chips 1 in the same memory module 100. For example, the wired communication part 13 may be an internal metal layer, such as aluminum, copper, silver, or the like. The resistance of metal layer is low, which is beneficial to reduce the power consumption.

A plurality of lower communication parts 11*b* in the same memory module 100 are aligned in the second direction Y. A plurality of upper communication parts 11*a* in the same memory module 100 are aligned in the second direction Y. The second wireless communication parts 11 in the top layer of memory module 100 are aligned in the second direction Y. Therefore, it is beneficial to improve the uniformity of semiconductor structure and the production process is simpler. Further, the distances between adjacent second wireless communication parts 11 can be unified to improve the consistency of communication delays.

Two adjacent second wireless communication parts 11 located on different memory chips 1 in the first direction X face each other. In other words, for two adjacent memory chips 1 in the first direction X, the lower communication part 11*b* of the memory chip 1 located above is opposite to the upper communication part 11*a* of the memory chip 1 located below. Compared with oblique alignment, the opposite arrangement is beneficial to reduce the distance between two adjacent second wireless communication parts 11, thereby improving the communication quality and speed.

In the same memory chip 1, two second wireless communication parts 11 face to each other in the first direction X, thereby facilitating the reduction of the length of the wired communication part 13 between the two second wireless communication parts 11 to shorten the communication delay.

Two second wireless communication parts 11 in the memory chip 1 in the non-top layer are located on the upper edge and the lower edge of the memory chip 1, respectively, thus facilitating the reduction of the distance between two second wireless communication parts 11 located on different memory chips 1, thereby improving the communication quality and speed.

The second wireless communication part 11 of each memory chip 1 in the top layer is located at a lower edge of the respective memory chip 1. Compared with being located at the upper edge or the middle of the memory chip 1, the second wireless communication part 11 being located at the lower edge is beneficial to reduce the distance between the second wireless communication part 11 of the memory chip 1 in the top layer and the second wireless communication part 11 of the memory chip 1 in the sub-top layer, thereby improving the communication quality and speed.

The first wireless communication part 31 is located at the edge of the logic chip 3 facing the memory chip 1. Compared with being located at the middle or the lower edge of the logic chip 3, the first wireless communication part 31 being located at the upper edge of the logic chip 3 may reduce the distance between the first wireless communication part 31 and the second wireless communication part 11, thereby improving the quality and speed of the wireless communication.

Each memory chip 1 in the non-top layer includes a solder pad 52 and a solder bump 51, and each memory chip 1 in the top layer includes a solder bump 51. The solder pad 52 is located on a top surface of the memory chip 1, and the solder bump 51 is located on a bottom surface of the memory chip 1. It is to be noted that the above-mentioned top surface refers to the top surface of the memory chip 1 connected with the solder pad 52, and the above-mentioned bottom surface refers to the bottom surface of the memory chip 1 connected with the solder bump 51.

For two adjacent memory chips 1 in the first direction X, a solder bump 51 of a memory chip 1 located above is soldered with a solder pad 52 of a memory chip 1 located below, and the solder bump 51 of memory chip 1 in a bottom layer is soldered with the logic chip 3. For example, the upper surface of the logic chip 3 also includes a solder pad 52 which is soldered with the solder bump 51 of the memory chip 1 in the bottom layer. There is also a solder layer 53 between the solder pad 52 and the solder bump 51. That is, the soldering manner facilitates improving the solidity of the stack of the memory modules 100.

For example, the solder bump 51 may be protruded on the bottom surface of the memory chip 1, and the solder pad 52 may be protruded on the top surface of the memory chip 1. That is, for two adjacent memory chips 1 in the first direction, the bottom surface of the memory chip 1 located above is spaced from the top surface of the memory chip 1 located below. Thus, the distance between the adjacent memory modules 100 can be appropriately increased, thereby improving the level of the heat dissipation of the memory modules 100.

The ratio of a height of the solder pad 52 to a height of the memory chip 1 in the first direction X ranges from 1:1250 to 1:1350, such as 1:1300; and a ratio of a height of the solder bump 51 to the height of the memory chip 1 ranges from 1:210 to 1:230, such as 1:220. When the ratio of the height of the solder pad 52 to the memory chip 1 and the ratio of the height of the solder bump 51 to the memory chip 1 are within the above ranges, it is advantageous to improve the solder strength and to keep the distance between the adjacent memory modules 100 within a reasonable range so as to facilitate heat dissipation.

The power supply manner of the memory chips 1 will be described in detail below.

Figure 3:
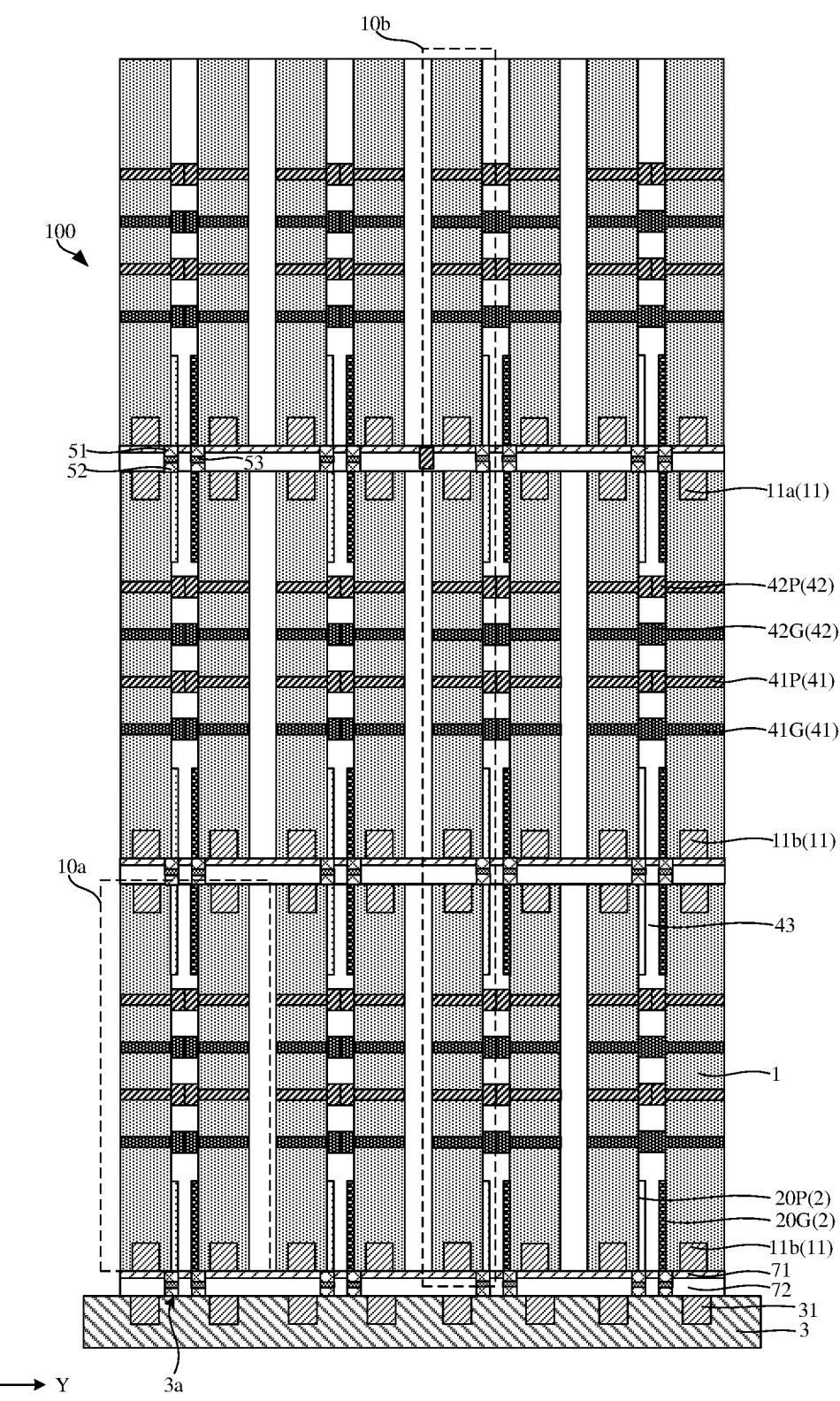

It is to be noted that FIG. 3 and FIG. 2 are different cross sections of the semiconductor structure. FIG. 3 illustrates the conductive vias 41 and the bonding parts 42 but does not illustrate the wired communication parts 13. Referring to FIG. 3, at least one of a plurality of memory chips 1 in a same memory module 100 includes a power supply wiring layer 2; all memory chips 1 in at least one of the memory cells 10*b* include power supply wiring layers 2; a power supply wiring layer 2 of a memory chip 1 in the non-top layer is electrically connected with a respective solder pad 52 and a respective solder bump 51; a power supply wiring layer 2 of a memory chip 1 in the top layer is electrically connected with a respective solder bump 51; and the logic chip 3 includes power supply ports 3*a*, and solder bumps 51 of memory chips 1 in the bottom layer are connected with the power supply ports 3*a*.

In other words, the connected power supply wiring layer 2, the solder pad 52 and the solder bump 51 in at least one memory cell 10*b* may form a power supply path. The solder pad 52 and the solder bump 51 not only serve to connect adjacent memory modules 100, but also serve as a wired power supply structure for the memory chip 1. The wired power supply manner can improve the stability and reliability of the power supply.

In some embodiments, referring to FIG. 5, FIG. 6, FIG. 8 and FIG. 9, the power supply wiring layer 2 may extend along the active surface 13 of the memory chip 1. That is, the power supply wiring layer 2 is located on the front surface of the memory chip 1, therefore, the power supply wiring layer 2 may be manufactured by using the original back-stage process after the components in the memory chip 1 are manufactured, and the process may be simpler. In addition, the power supply wiring layer 2 may extend only at edges near the upper and lower sides of the memory chip 1 without covering the entire active surface 13 of the memory chip 1. Therefore, the contact area between the power supply wiring layer 2 and the memory chip 1 is small, and the heat of the power supply wiring layer 2 has little influence on the memory chip 1.

The width of the power supply wiring layer 2 in the second direction Y is smaller than the width of the solder bump 51 in the second direction Y. The width of the power supply wiring layer 2 in the second direction Y is smaller than the width of the solder pad 52 in the second direction Y. That is, the solder bump 51 and the solder pad 52 have a larger volume and smaller resistance, and are advantageous in improving the soldering strength. In addition, it is advantageous to increase the contact area of the solder bump 51 and the solder pad 52 with the power supply wiring layer 2, thereby reducing the contact resistance.

It is to be noted that the wireless communication manner does not occupy the space between adjacent memory modules 10. Therefore, it is possible to lay out the wired power supply flexibly even if the area of the opposite side of adjacent memory modules 100 is small.

Referring to FIG. 5, FIG. 6, FIG. 8, and FIG. 9, each memory chip 1 is provided with a power supply signal line 12, and the power supply signal line 12 is electrically connected to the power supply wiring layer 2. The connection relationship between the power supply signal line 12 and the power supply wiring layer 2 will be described in detail below.

Each memory chip 1 is provided with a plurality of power supply signal lines 12, and different power supply signal lines 12 can provide different voltage signals, such as digital signal or analog signal, for the elements in the memory chip 1. The power supply signal line 12 may be a ground signal line 12G or a power source signal line 12P. Different ground signal lines 12G have different voltage signals and different power source signal lines 12P have different voltage signals.

The power supply wiring layer 2 may be a power source wiring layer 2P, a ground wiring layer 2G, or a hybrid wiring layer 2PG. That is, the power supply wiring layer 2 in a memory chip 1 includes a plurality of power supply wiring 20 isolated from each other, and the power supply wiring layer 2 can be divided into the above three categories according to the type of power supply wirings 20 of each power supply wiring layer 2. When the power supply wirings 20 in the power supply wiring layer 2 are all power source wirings 20P, this power supply wiring layer 2 is referred to as a power source wiring layer 2P. When the power supply wirings 20 in the power supply wiring layer 2 are all ground wiring 20G, this power supply wiring layer 2 is referred to as a ground wiring layer 2G. When the power supply wiring layer 2 includes both the ground wiring 20G and the power source wiring 20P, the power supply wiring layer 2 is referred to as a hybrid wiring layer 2PG.

The ground wiring 20G is electrically connected with the ground signal line 12G correspondingly, and the power source wiring 20P is electrically connected with the power source signal line 12P correspondingly. It is to be noted that a plurality of power supply wiring lines 20 in the power supply wiring layer 2 are insulated from each other, such that the power supply signal lines 12 having different voltage signals can be led out separately.

If a memory chip 1 includes a power supply wiring layer 2 itself, at least part of the power supply signal lines 12 of the memory chip 1 can be directly connected to its own power supply wiring layer 2, that is, led out through its own power supply wiring layer 2. If a memory chip 1 does not have a power supply wiring layer 2, the power supply signal line 12 of the memory chip 1 can be led out through the power supply wiring layer 2 of another memory chip 1. In other words, the memory chip 1 can be electrically connected with another memory chip 1 through the conductive via 41 and the bonding part 42, thereby electrically connecting its own power supply signal line 12 with the power supply signal line 12 of another memory chip 1, and further electrically connecting with the power supply wiring layer 2 of another memory chip 1.

It is to be noted that, within the same memory cell 10b, the power supply wirings 20 having the same voltage signal are electrically connected together through the solder pad 52 and the solder bump 51, as such, this voltage signal can be supplied to a plurality of memory chips 1 in the first direction X.

A plurality of memory chips 1 may be stacked in a hybrid bonding manner. For example, the surface of the memory chip 1 is further provided with a dielectric layer 43, and the dielectric layers 43 of adjacent memory chips 1 may be connected together by an acting force, such as a molecular force. Further, the surface of the memory chip 1 may further be provided with a bonding part 42, and adjacent bonding parts 42 are bonded together under a temperature rising condition. That is, the dielectric layer 43 is made of an insulating material and is capable of acting as an isolation. The bonding part 42 is a conductive material and capable of acting as an electrical connection. Further, the dielectric layer 43 exposes the end face of the power supply wiring layer 2 facing or facing away from the logic chip 3 and covers the side surfaces of the power supply wiring layer 2 except the end face.

The relationship between the number of the memory chip 1 and the number of the power supply wiring layer 2 will be described in detail below.

In to first example, referring to FIG. 2 to FIG. 11, each memory chip 1 includes a power supply wiring layer 2, that is, the number of memory chips 1 is the same as the number of power supply wiring layers 2. Since the number of the power supply wiring layers 2 is large, it is possible to provide sufficient led out positions for a plurality of power supply signal lines 12, that is, the process of leading out the power supply signal lines 12 can be simplified. In addition, more power supply wiring layers 2 are also beneficial to improve the stability of power supply, thereby improving the performance of semiconductor structure. In addition, the power supply wiring layers 2 are uniformly disposed in a plurality of memory chips 1, therefore, it is beneficial to unify the manufacturing processes of different memory chips 1, so as to reduce the production cost.

In some embodiments, referring to FIG. 2 to FIG. 9, the memory modules 100 include a plurality of chip sets 10a, each chip set 10a includes two adjacent memory chips 1 bonded with each other. Two power supply wiring layers 2 are disposed between two memory chips 1 of a same chip group 10*a*, and the two power supply wiring layers 2 are located on surfaces of the two memory chips 1, respectively; each of the two power supply wiring layers 2 is electrically connected with the two memory chips 1. That is, the two memory chips 1 of the chip set 10*a* are bonded face to face, that is, the active surface faces to the active surface. Two memory chips 1 of the same chip set 10*a* share two power supply wiring layers 2 located between the two memory chips 1.

Specifically, referring to FIG. 3, a conductive via 41 is provided in the memory chip 1. For example, the conductive via 41 is Through-Silicon Via (TSV). A bonding part 42 is provided between two memory chips 1 of the same chip set 10*a*, and the bonding part 42 is connected with the conductive via 41 of the two memory chips 1, so as to electrically connect the two memory chips 1. For example, a plurality of conductive vias 41 are spaced from each other in each memory chip 1, and the plurality of conductive vias 41 are connected with a plurality of power supply signal lines 12 in the memory chip 1 one by one. The voltage signals on the plurality of power supply signal lines 12 in the same memory chip 1 are different, and accordingly, the voltage signals on the plurality of conductive vias 41 in the same memory chip 1 are also different. In two memory chips 1 of the same chip set 10*a*, the conductive vias 41 having the same voltage signal are electrically connected through the bonding part 42, so that the power supply signal lines 12 having the same voltage signal in the two memory chips 1 are electrically connected together.

For example, the conductive via 41 includes a plurality of ground vias 41G and a plurality of power source vias 41P, and the bonding part 42 includes a plurality of ground bonding parts 42G and a plurality of power source bonding parts 42P. The ground via 41G is connected with the ground bonding part 42G, and the power source via 41P is connected with the power source bonding part 42P.

The conductive vias 41 of each memory chip 1 may be spaced in a third direction Z, and the third direction Z is perpendicular to the upper surface of the logic chip 3. For example, the ground vias 41G and the power source vias 41P are alternately arranged in the third direction Z to reduce electromagnetic interference of adjacent conductive vias 41.

Figure 4:
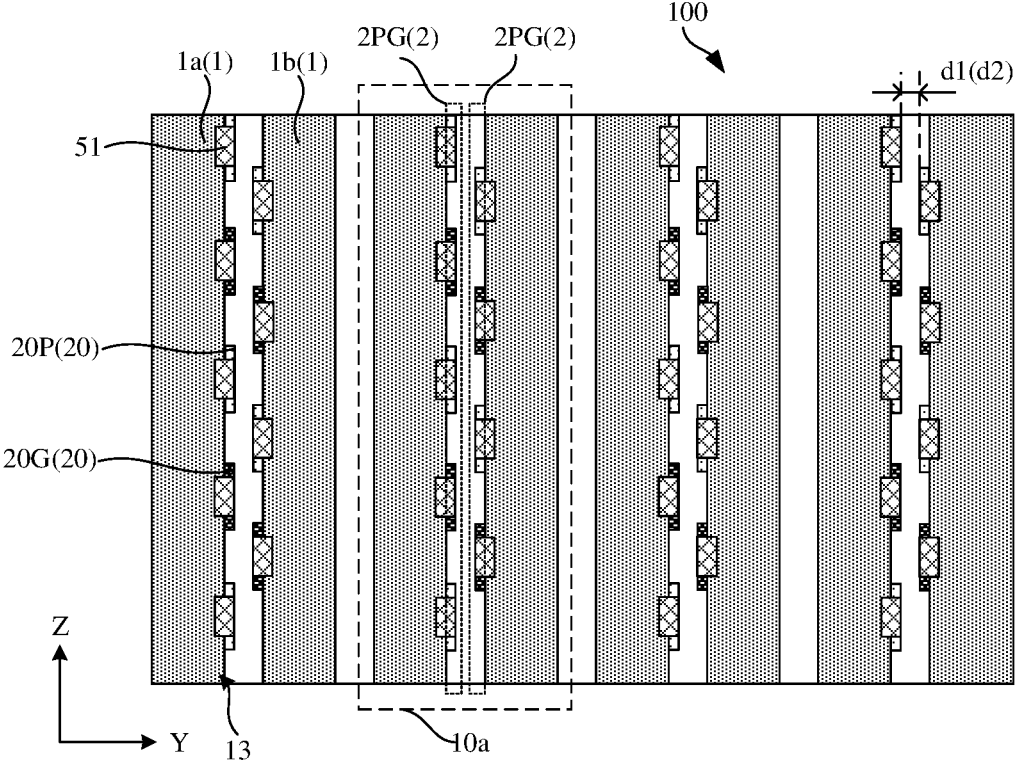
FIG. 4, FIG. 7, FIG. 11, FIG. 13 and FIG. 15 illustrate bottom views of different memory modules provided by an embodiment of the present disclosure respectively.
Figure 5:
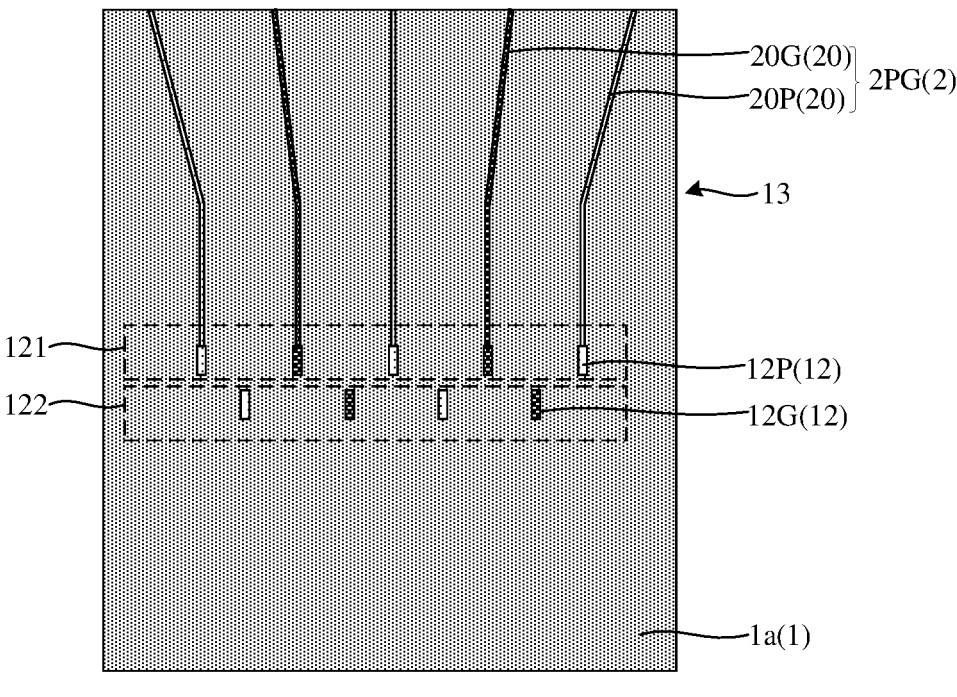
FIG. 5, FIG. 6, FIG. 8 and FIG. 9 illustrate schematic diagrams of different active surfaces of a memory chip provided by an embodiment of the present disclosure respectively.
Figure 6:
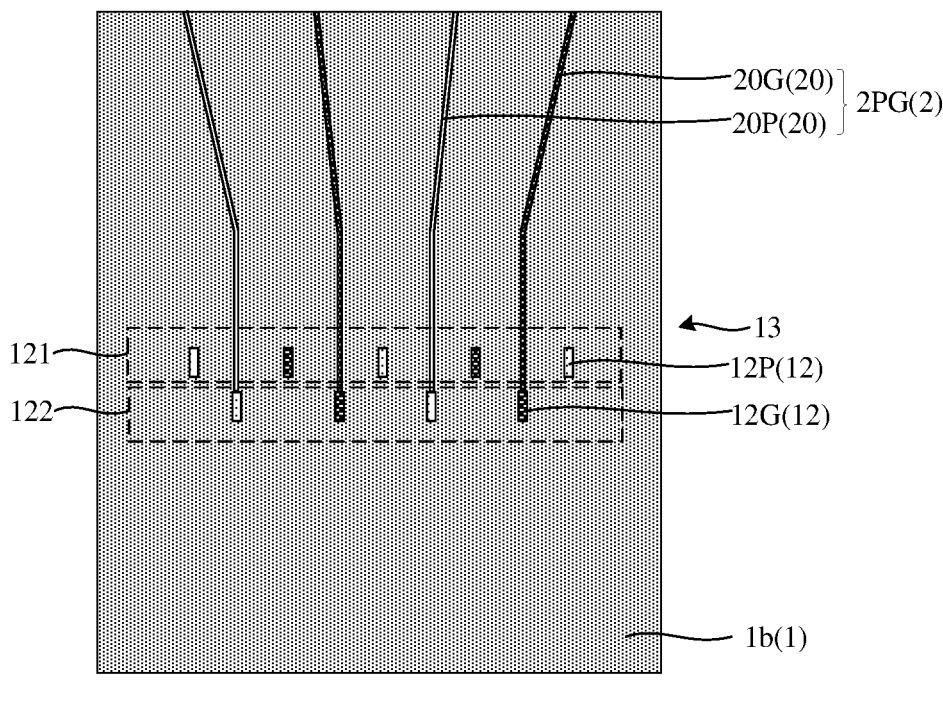

FIG. 4 is a bottom view of the memory modules 100, FIG. 5 and FIG. 6 are schematic diagrams of active surfaces 13 of two memory chips 1 of a chip set 10*a*, respectively, and FIG. 4 to FIG. 7 correspond to a same semiconductor structure. Referring to FIG. 4 to FIG. 7, the chip set 10*a* includes a first memory chip 1*a* and a second memory chip 1*b*. Each memory chip 1 includes a first power supply signal line group 121 and a second power supply signal line group 122. The power supply signal lines 12 of both the first power supply signal line group 121 and the second power supply signal line group 122 include a power source signal line 12P and a ground signal line 12G. The first power supply signal line groups 121 of the two memory chips 1 are led out through the power supply wiring layer 2 of the first memory chip 1*a*, and the second power supply signal line groups 122 of the two memory chips 1 are led out through the power supply wiring layer 2 of the second memory chip 1*b*. That is, both power supply wiring layers 2 of the same chip set 10*a* are hybrid wiring layers 2PG.

Continuing with reference to FIG. 4, in the hybrid wiring layer 2PG, the ground wirings 20G and the power source wirings 20P are alternately arranged in the third direction Z, thereby facilitating the reduction of electromagnetic interference of adjacent power supply wirings 20.

Figure 7:
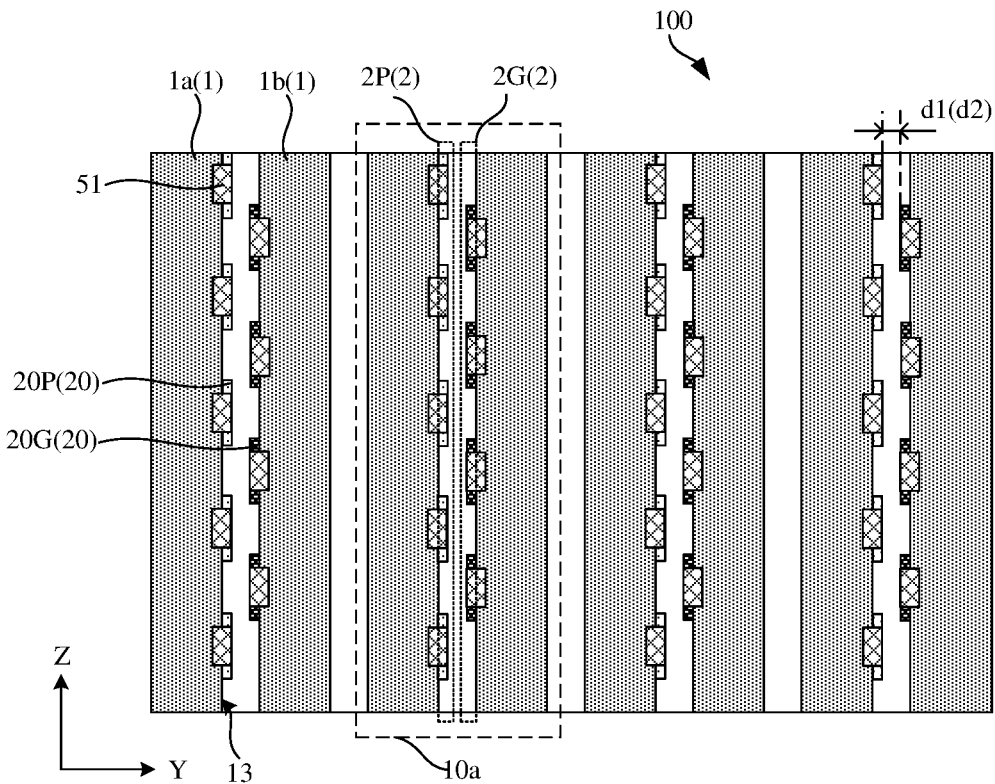
Figure 8:
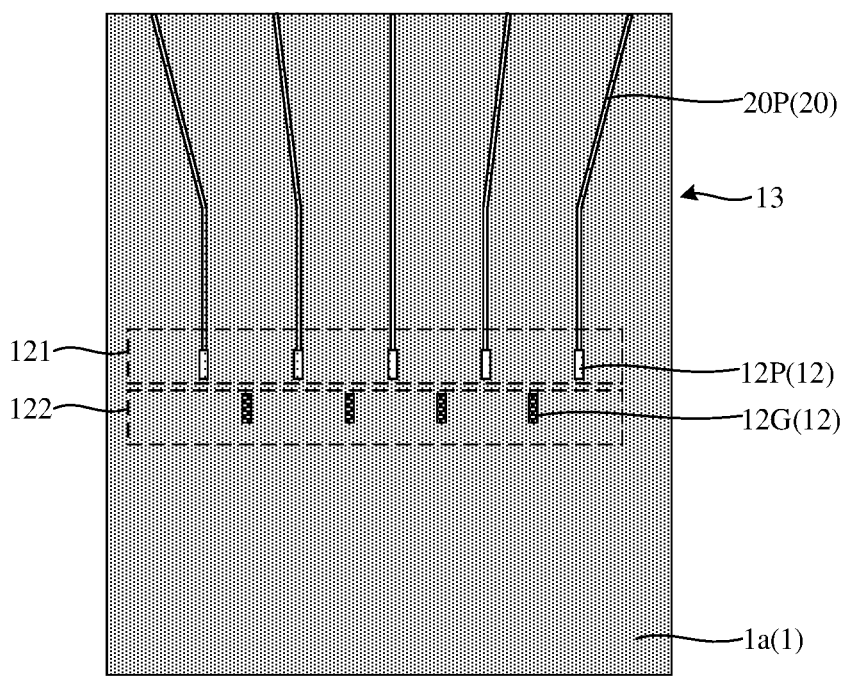
Figure 9:
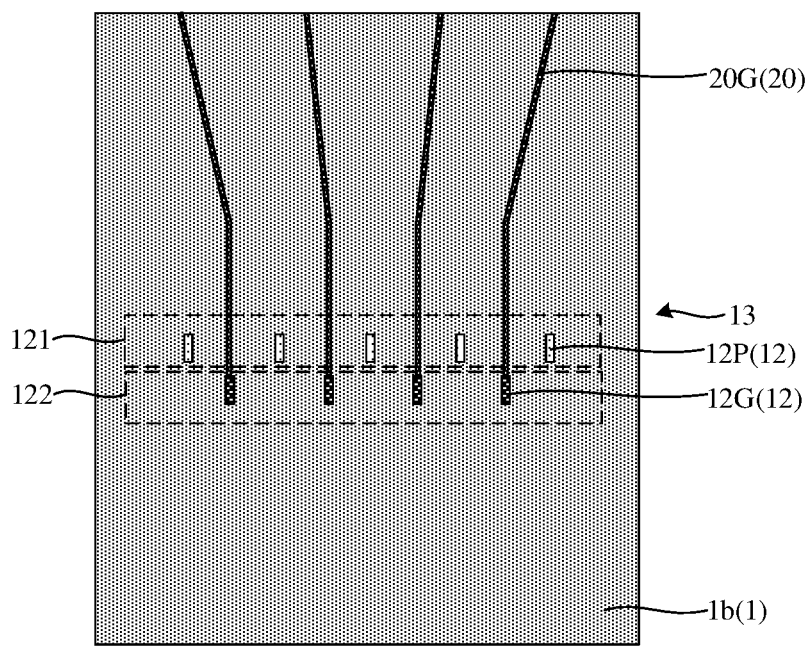

FIG. 7 is a bottom view of the memory modules 100, FIG. 8 and FIG. 9 are schematic diagrams of active surfaces 13 of two memory chips 1 of a chip set 10*a*, respectively, and FIG. 7 to FIG. 9 correspond to a same semiconductor structure. Referring to FIG. 7 to FIG. 9, the power supply signal lines 12 of the first power supply signal line group 121 are all power source signal lines 12P, and the power supply signal lines 12 of the second power supply signal line group 121 are all ground signal lines 12G. The first power supply signal line groups 121 of the two memory chips 1 are led out through the power supply wiring layer 2 of the first memory chip 1*a*, and the second power supply signal line groups 122 of the two memory chips 1 are led out through the power supply wiring layer 2 of the second memory chip 1*b*. That is, two power supply wiring layers 2 of the same chip group 10*a* are a power source wiring layer 2P and a ground wiring layer 2G, respectively, the first power supply signal line group 121 is electrically connected to the power source wiring layer 2P, and the second power supply signal line group 122 is electrically connected to the ground wiring layer 2G.

So far, based on FIG. 4 to FIG. 9, each memory chip 1 includes a first power supply signal line group 121 and a second power supply signal line group 122. Both the first power supply signal line group 121 and the second power supply signal line group 122 include a plurality of power supply signal lines 12. Two first power supply signal line groups 121 in the same chip set 10*a* are electrically connected to a power supply wiring layer 2, and two second power supply signal line groups 122 in the same chip set 10*a* are electrically connected to another power supply wiring layer 2. That is, the power supply wiring layer 2 is shared by two power supply wiring layers 2 of the same chip set 10*a*.

The advantages of this design mainly include the following aspects. Firstly, the shared power supply wiring layer 2 is located between two memory chips 1, which can shorten the distance between the power supply wiring layer 2 and the two memory chips 1, thereby reducing the high power consumption generated due to the long distance. Secondly, only the dielectric layer 43 for insulation may be provided between adjacent chip sets 10*a*, such that the number of bonding parts 42 may be reduced to simplify the production process. Thirdly, the power supply wiring layer 2 is shared by two memory chips 1, and accordingly, the number of power supply wirings 20 is reduced, and the number of solder bumps 51 and solder pads 52 is reduced, thereby facilitating the provision of more sufficient space locations for the solder bumps 51 and avoiding short circuit. Fourthly, only two memory chips 1 in the chip set 10*a* share the power supply wiring layer 2, that is, the number of memory chips 1 in the chip set 10*a* is small, which is beneficial for ensuring the stability of power supply.

Referring to FIG. 4 and FIG. 7, there is a first distance d1 between two power supply wiring layers 2 in the same chip set 10*a* in the second direction Y. The solder bumps 51 connected to different power supply wiring layers 2 in the same chip set 10*a* have a second distance d2. There is a third distance between solder pads 52 connected to different power supply wiring layers 2 in the same chip set 10*a*. The ratio of the first distance d1 to the second distance d2 ranges from 1:1 to 1.2:1. The ratio of the first distance d1 to the third distance ranges from 1:1 to 1.2:1. It is to be noted that if the second distance d2 and the third distance are too large, the space between adjacent memory chips 1 may be wasted. If the second distance d2 and the third distance are too small, an erroneous electrical connection may occur between adjacent solder bumps 51 and adjacent solder pads 52. When the distance ratios are kept in the above-mentioned ranges, it is beneficial to balance the above two problems. For example, as illustrated in FIG. 4 and FIG. 7, the first distance d1 may be the same as the second distance d2.

Figure 10:
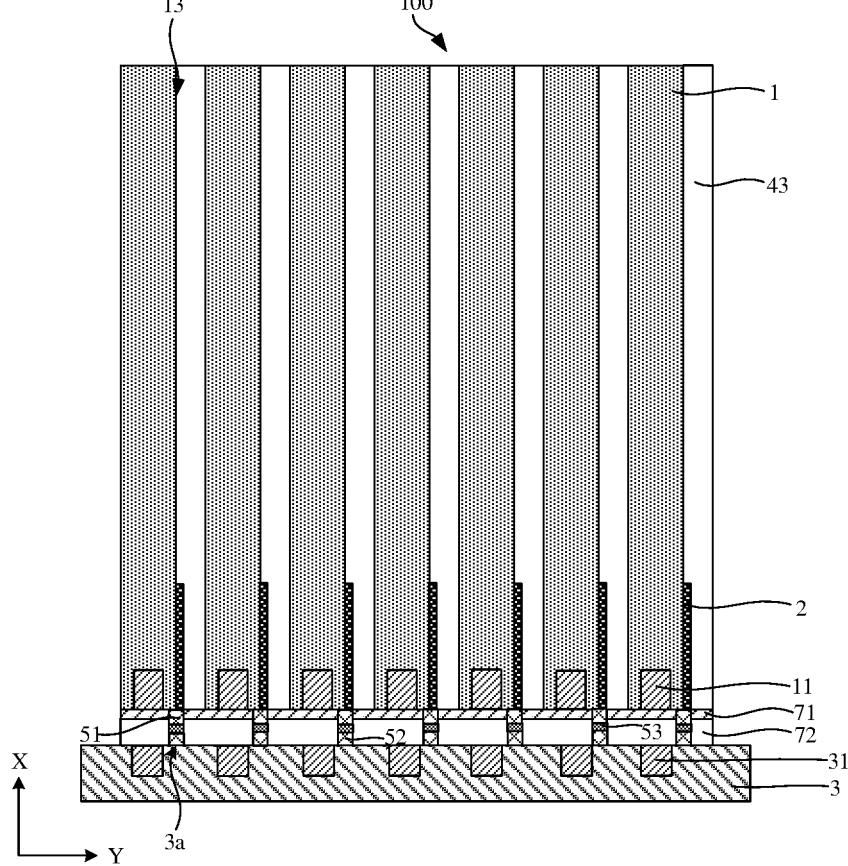
FIG. 10, FIG. 12 and FIG. 14 illustrate two schematic partial cross-section views of different semiconductor structures provided by an embodiment of the present disclosure respectively.
Figure 11:
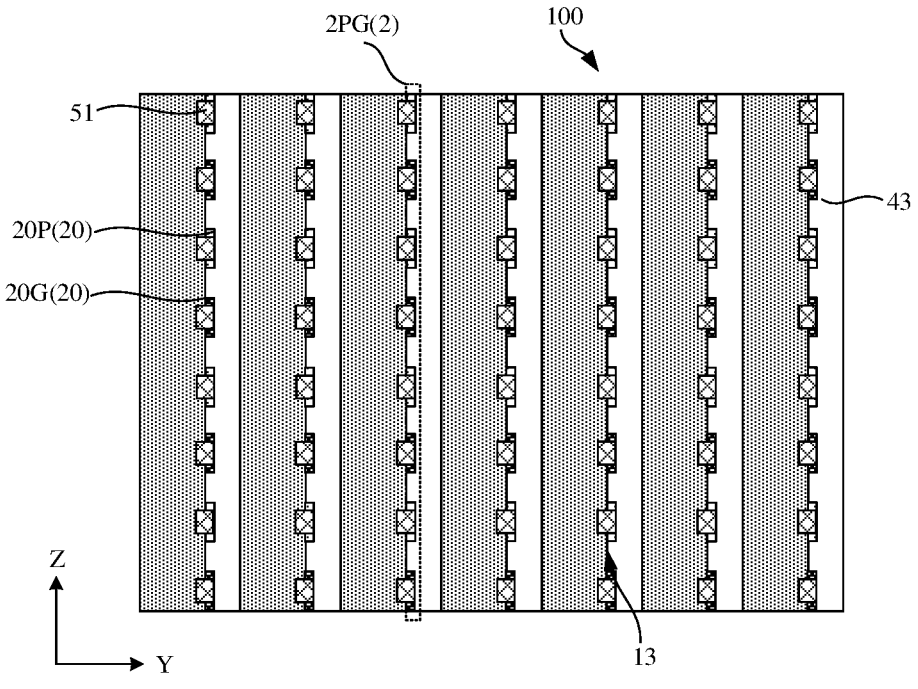

Referring to FIG. 10 and FIG. 11, FIG. 10 is a partial cross-section view and FIG. 11 is a bottom view of the memory module 100 illustrated in FIG. 10. The power supply signal lines 12 in the same memory chip 1 are connected with the power supply wiring layer 2, the power supply wiring layers 2 of different memory chips 1 are independent of each other, and the power supply signal lines 12 of different memory chips 1 are independent of each other. That is, the power supply signal lines 12 of a plurality of memory chips 1 do not need be electrically connected together through the conductive vias 41 and the bonding parts 42, and the power supply signal lines 12 in each memory chip 1 may be led out through the power supply wiring layer 2 of the respective memory chip 1 itself without being led out by the power supply wiring layer 2 of other memory chips 1. Since the power supply signal lines 12 of each memory chip 1 may be led out separately, it is beneficial to improve the stability of power supply. Further, the step of manufacturing the bonding parts 42 and the conductive vias 41 may be omitted, such that the production cost may be reduced.

Continuing with reference to FIG. 11, for example, the power supply wiring layer 2 of each memory chip 1 may be a hybrid wiring layer 2PG, and the power source wiring 20P and the ground wiring 20G are alternately arranged in the third direction Z to reduce electromagnetic interference. Further, a plurality of power supply wiring layers 2 may be formed on the same side of the memory chip 1, thereby unifying the manufacturing process of the power supply wiring layers 2.

Further, the power source wirings 20P of the plurality of memory chips 1 may be aligned in line in the second direction Y, and the ground wirings 20G of the plurality of memory chips 1 may be aligned in line in the second direction Y. Alternatively, the power source wirings 20P and the ground wirings 20G may be alternately arranged in the second direction Y and arranged in line. Therefore, it is beneficial to improve the uniformity of semiconductor structure and the production process is simpler.

Figure 12:
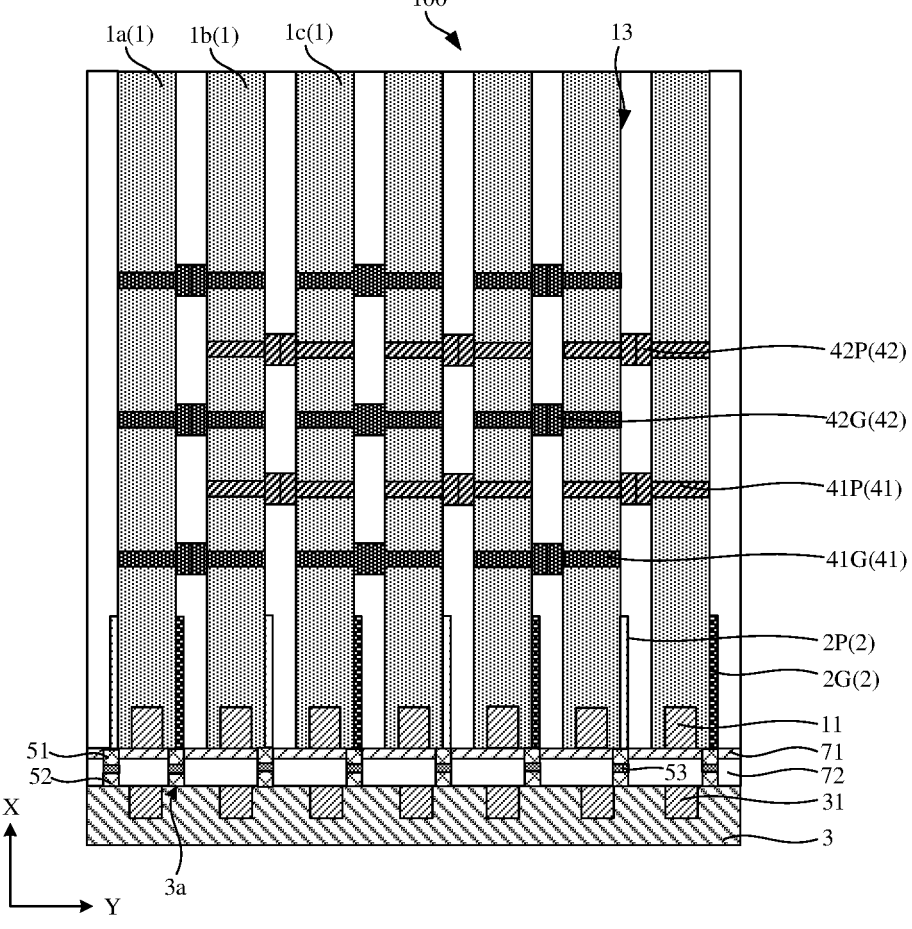
Figure 13:
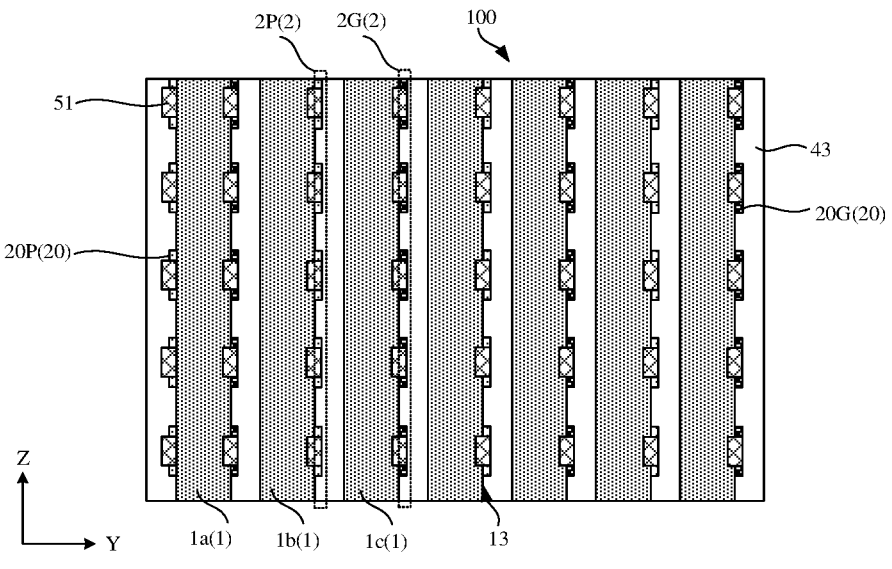

In a second example, the number of power supply wiring layers 2 may be more than the number of memory chips 1. For example, referring to FIG. 12 and FIG. 13, FIG. 12 is a partial cross-section view and FIG. 13 is a bottom view of the memory module 100 illustrated in FIG. 12. A power supply wiring layer 2 is provided between two adjacent memory chips 1, and the power supply wiring layer 2 is electrically connected with the memory chips 1 on both sides thereof. One power supply wiring layer 2 is provided on each of two sides of a memory module 100, and is electrically connected with the respective memory chip 1 on the side of the memory module 100. That is, except that the two power supply wiring layers 2 on both sides are not shared by the memory chips 1, each of other power supply wiring layers 2 in the middle is shared by the memory chips 1 on both sides of the respective power supply wiring layer 2. The memory chips 1 on the sides of the memory module 100 may also be understood as the memory chips 1 on the outermost sides of the memory module 100. A power supply wiring layer 2 in the middle is connected to the power supply signal lines 12 of two memory chips 1, such that it is facilitating to reduce the number of solder bumps 51 and the production process is simple. In addition, the distribution locations of the power supply wiring layers 2 in the memory module 100 is relatively uniform, which is beneficial to simplify the production process.

As illustrated in FIG. 13, in some embodiments, the power supply wiring layer 2 includes a power source wiring layer 2P and a ground wiring layer 2G, the power source wiring layer 2P includes a plurality of power source wirings 20P, and the ground wiring layer 2G includes a plurality of ground wirings 20G. The power source wiring layer 2P and the ground wiring layer 2G are alternately arranged in the first direction X. In other embodiments, all power supply wiring layers 2 may also be hybrid wiring layers 2PG, and the voltage signals of power supply signal lines 12 led out from adjacent hybrid wiring layers 2PG are different.

Continuing to refer to FIG. 12 and FIG. 13, the sharing manner of the power supply wiring layer 2 will be described below. The power source wiring layer 2P located at the head side of the memory module 100 may be directly connected to the power source signal line 12P of the first memory chip 1a, therefore, the first memory chip 1a may not include the power source via 41P and the power source bonding part 42P. The first memory chip 1a and the second memory chip 1b share the ground wiring layer 2G, that is, the ground signal lines 12G of the first memory chip 1a and the second memory chip 1b are connected together through the ground via 41G and the ground bonding part 42G, and are led out through the ground wiring layer 2G between the first memory chip 1a and the second memory chip 1b. The second memory chip 1b and the third memory chip 1c share the power source wiring layer 2P, that is, the power source signal lines 12P of the second memory chip 1b and the third memory chip 1c are connected together through the power source via 41P and the power source bonding part 42P and are led out through the power source wiring layer 2P between the second memory chip 1b and the third memory chip 1c. Since the second memory chip 1b and the third memory chip 1c do not share the ground wiring layer 2G, the ground via 41G and the ground bonding part 42G of the second memory chip 1b and the third memory chip 1c will not be electrical connected.

That is, if the power supply wiring layer 2 between two adjacent memory chips 1 is the power source wiring layer 2P, the two memory chips 1 are electrically connected through the power source via 41P and the power source bonding part 42P. Similarly, if the power supply wiring layer 2 between two adjacent memory chips 1 is a ground wiring layer 2G, the two memory chips 1 are electrically connected through a ground via 41G and a ground bonding part 42G.

It is to be noted that since the number of power supply wiring layers 2 is one more than the number of memory chips 1, one of the two power supply wiring layers 2 on the head and tail sides may not extend along the active surface 13 of the respective memory chip 1, that is, be disposed on the back surface of the respective memory chip 1. Other power supply wiring layers 2 are still disposed on the active surface 13 of the memory chips 1.

Figure 14:
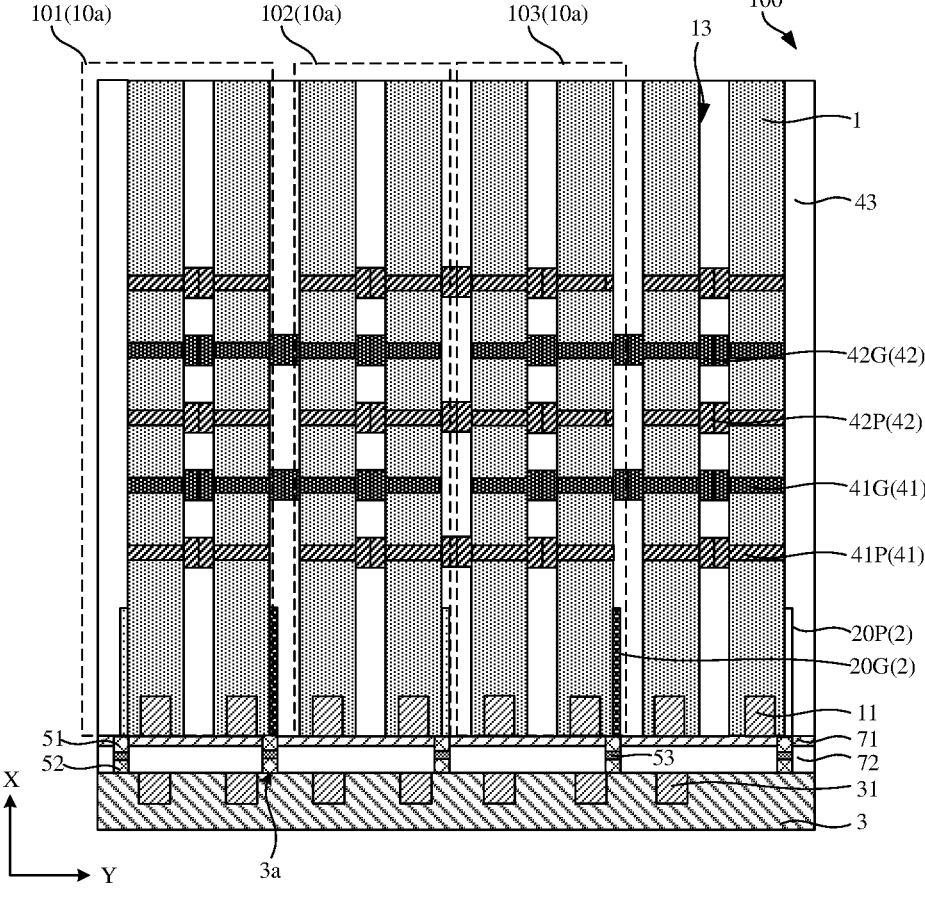
Figure 15:
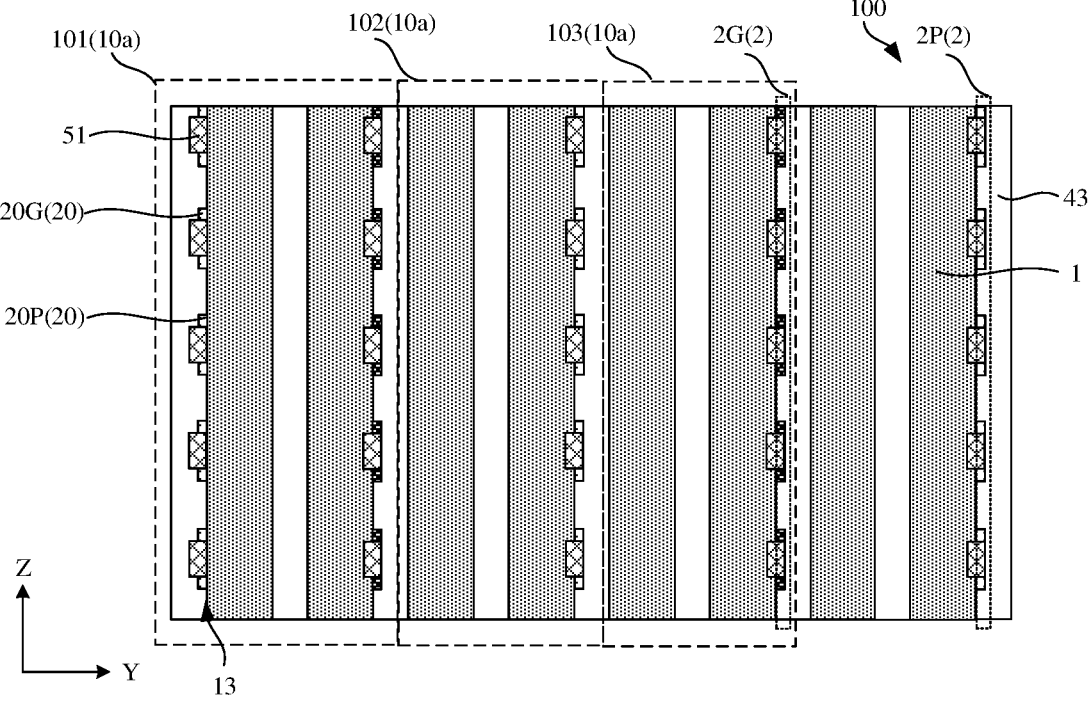

In a third example, the number of power supply wiring layers 2 may be less than the number of memory chips 1. For example, referring to FIG. 14 and FIG. 15, FIG. 14 is a partial cross-section view and FIG. 15 is a bottom view of the memory module 100 illustrated in FIG. 14. At least two adjacent memory chips 1 are bonded and form a chip set 10a. A power supply wiring layer 2 is provided between two adjacent chip sets 10a, and the power supply wiring layer 2 is electrically connected with the memory chips 1 of the chip sets 10a on both sides of the power supply wiring layer 2. One power supply wiring layer 2 is provided on each of two sides of the memory module 100, and is electrically connected with the respective chip set 10a on the side of the memory module 100.

That is, except that the two power supply wiring layers 2 on both sides are not shared by the chip sets 10a, each of other power supply wiring layers 2 in the middle is shared by the chip sets 10a on both sides of the respective power supply wiring layer 2. A power supply wiring layer 2 in the middle is connected to the power supply signal lines 12 of two chip sets 10a. It is to be noted that the smaller the number of the power supply wiring layers 2, the smaller the number of the solder bumps 51. Therefore, it is advantageous to increase the distance between the solder bumps 51 and the coils in the first wireless communication part 31 and the second wireless communication part 11, thereby reducing electromagnetic interference generated by the solder bumps 51 and the coils, so as to avoid the signal loss.

For example, each chip set 10a includes two memory chips 1, the power supply signal lines 12 having the same voltage signal in the two memory chips 1 are connected together through the conductive vias 41 and bonding parts 42.

Continuing to refer to FIG. 14 and FIG. 15, the sharing manner of the power supply wiring layer 2 will be described below. The first chip set 101 and the second chip set 102 share the ground wiring layer 2G, that is, the ground signal lines 12G of the first chip set 101 and the second chip set 102 are connected together through the ground via 41G and the ground bonding part 42G, and are led out through the ground wiring layer 2G between the first chip set 101 and the second chip set 102. Since the first chip set 101 and the second chip set 102 do not share the power source wiring layer 2P, the power source via 41P and the power source bonding part 42P of the first chip set 101 and the second chip set 102 will not be electrical connected. The second chip set 102 and the third chip set 103 share the power source wiring layer 2P, that is, the power source signal lines 12P of the second chip set 102 and the third chip set 103 are connected together through the power source via 41P and the power source bonding part 42P and are led out through the power source wiring layer 2P between the second chip set 102 and the third chip set 103.

In some embodiments, referring to FIG. 2, FIG. 3, FIG. 10, FIG. 12 and FIG. 14, the surface of the memory module 100 facing the logic chip 3 is further provided with an insulating film 71. The insulating film 71 may also be disposed between adjacent solder bumps 51, such that it can serve to insulate the solder bumps 51. In addition, the insulating film 71 may be made of a material with better adhesion property so as to serve as a fixation of the solder bumps 51. For example, the insulating film 71 may be a polyimide film. The polyimide film has properties of excellent high and low temperature resistance, electrical insulation and adhesion.

In some embodiments, there is also a filling adhesive layer 72 between the logic chip 3 and the memory chip 1, and the filling adhesive layer 72 covers the solder bumps 51. In addition, the filling adhesive layer 72 may cover the insulating film 71 and the solder pads 52. The filling adhesive layer 72 may serve to fix the solder bumps 51 and the solder pads 52, thereby ensuring the connection strength of the memory modules 100 and the logic chip 3.

In summary, the embodiments of the present disclosure can improve the difference in communication delay between the memory chips 1 and the logic chip 3 due to the difference of communication distances. In addition, the power supply wiring layers 2 of a plurality of memory chips 1 in the first direction X are connected together through the solder bumps 51 and the solder pads 52, and are connected with the power supply ports of the logic chip 3 through the solder bumps 51 of the bottom layer of memory module 100, thereby implementing wired power supply to improve the stability of power supply.

Figure 16:
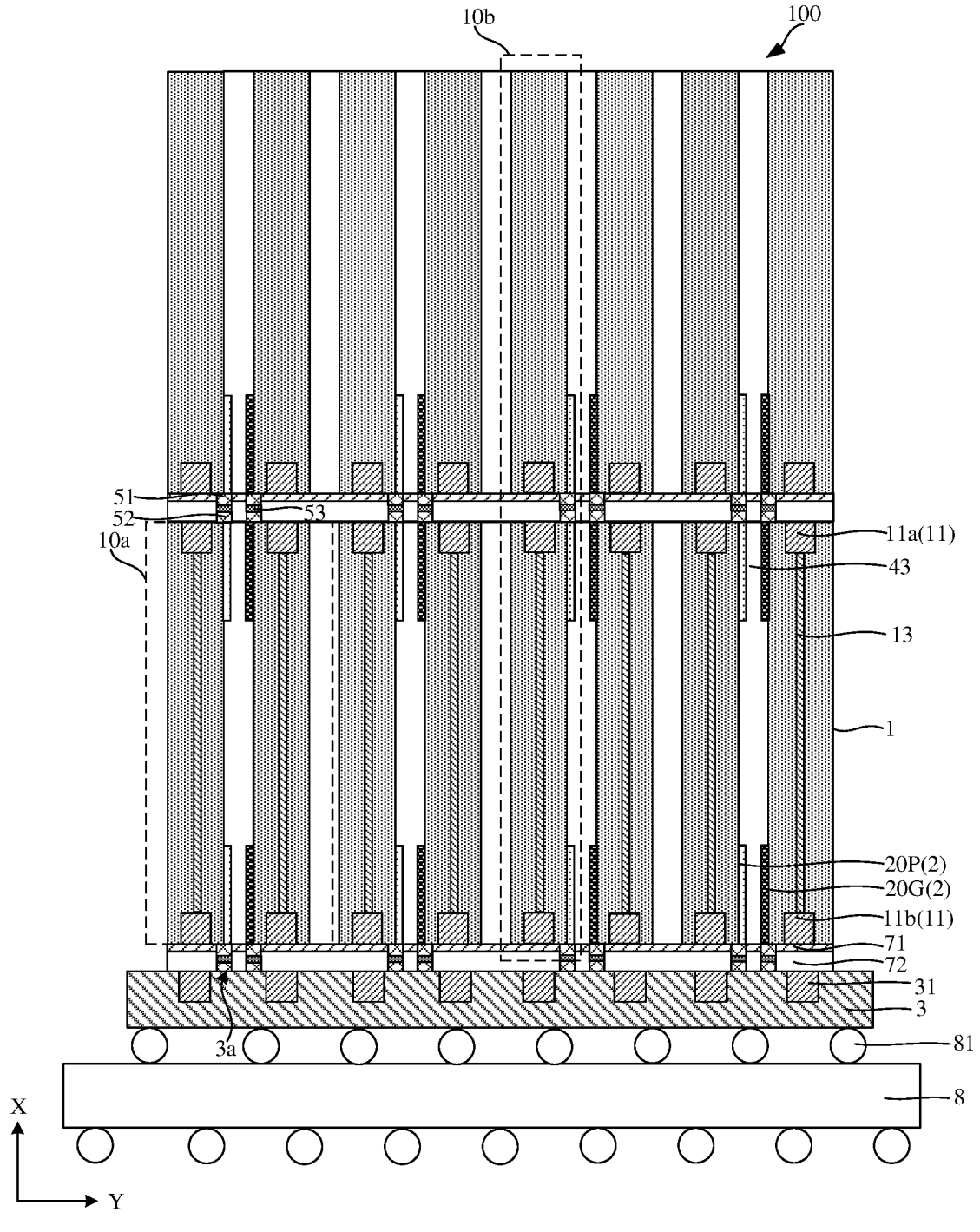
FIG. 16 illustrates a schematic diagram of a semiconductor device provided by another embodiment of the present disclosure.

As illustrated in FIG. 16, another embodiment of the present disclosure further provides a semiconductor device. The semiconductor device includes the semiconductor structure provided by the foregoing embodiments. Reference may be made to the foregoing embodiments for a detailed description of the semiconductor structure.

The semiconductor device includes: a substrate 8; a logic chip 3 disposed on the substrate 8 and including first wireless communication parts 31; and a plurality of layers of memory modules 100 stacked on the upper surface of the logic chip 3 in a first direction X, herein the first direction X is perpendicular to the upper surface of the logic chip 3. Each memory module 100 includes a plurality of memory chips 1 stacked in a second direction Y, and the second direction Y is parallel to the upper surface of the logic chip 3. Each memory chip 1 in a top layer includes one second wireless communication part 11; and each memory chip 1 in a non-top layer includes two second wireless communication parts 11 arranged in the first direction X and a wired communication part 13 connected between the two second wireless communication parts 11. Two adjacent second wireless communication parts 11 located on different memory chips 1 in the first direction X communicate with each other wirelessly; and each of the first wireless communication parts 31 communicates wirelessly with a second wireless communication part 11, which is closest to the first wireless communication part 31, in a bottom memory chip 1.

The substrate 8 may provide the functions of electrical connection, protection, support, heat dissipation, assembly and the like for the logic chip 3 and the memory modules 100. The logic chip 3 may be connected to the substrate 8 through solder balls 81. A power supply may be disposed on the substrate 8, and the power supply port 3a of the logic chip 3 is connected to the power supply on the substrate 8, thereby supplying power to the memory chips 1.

Another embodiment of the disclosure provides a method for manufacturing a semiconductor structure. The manufacturing method may be used to manufacture the semiconductor structure provided by the foregoing embodiments. Reference may be made to the foregoing embodiments for a detailed description of the semiconductor structure.

Figure 17:
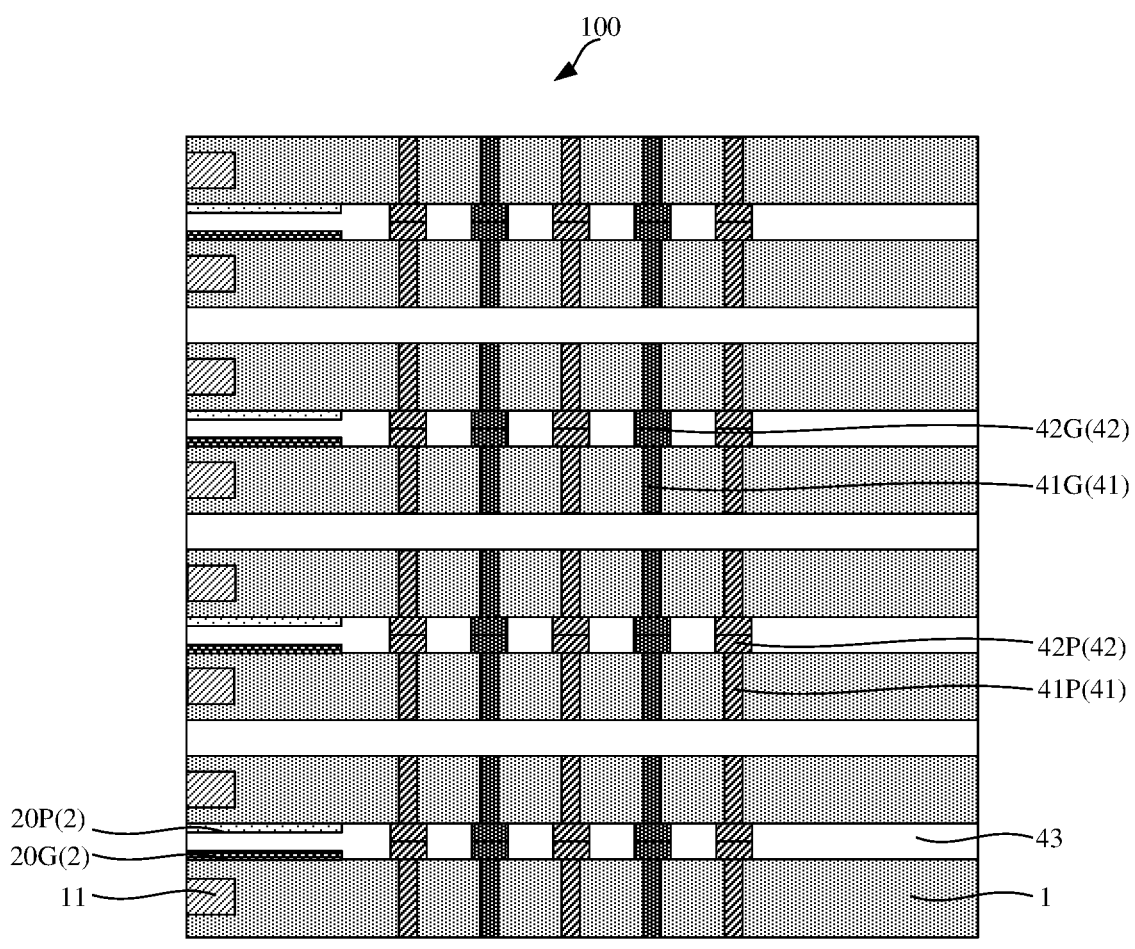
FIG. 17 illustrates a structural schematic diagram corresponding to a step of a method for manufacturing a semiconductor structure provided by another embodiment of the present disclosure.

Specifically, referring to FIG. 17, a memory chip 1 is provided, a second wireless communication part 11 and a wired communication part 13 are manufactured in the memory chip 1. A power supply wiring layer 2 is manufactured on the surface of the memory chip 1, and then the power supply signal line 12 is led to the edge of the memory chip 1. After forming the power supply wiring layer 2, a dielectric layer 43 covering the power supply wiring layer 2 and a bonding part 42 located in the dielectric layer 43 are formed. The bonding part 42 is formed, a plurality of memory chips 1 are stacked horizontally and bonded in a hybrid bonding manner, thereby forming a memory module 100. That is, during the process of stacking the memory chips 1, the memory chips 1 are placed in the horizontal direction.

Referring to FIG. 3, the memory module 100 is rotated 90 degrees, the solder bumps 51 are prepared on the side of the memory module 100, and the solder bumps 51 are connected with the power supply wiring layer 2. Thereafter the memory module 100 is rotated 180 degrees, the solder pads 52 are prepared on the side of the memory module 100 and the solder pads are connected with the power supply wiring layer 2. The power supply wiring layers 2 of different memory modules 100 are connected together in the first direction X through the solder bump 51 and the solder pad 52.

The technical solutions provided by the embodiments of the disclosure include at least the following advantages: in the first direction, a plurality of second wireless communication parts and the wired communication parts form a communication path, that is, the communication manner between the memory chips and the logic chip combines the wireless communication and the wired communication, and the wireless communication can omit the manufacturing step of the wired communication parts between adjacent memory chips, thereby reducing the process difficulty; and the wired communication can reduce communication loss. Further, a plurality of memory modules are arranged in the first direction, thereby improving the capacity density of the memory chip. Further, in the same memory module, the stacking direction of a plurality of memory chips is parallel to the upper surface of the logic chip. Therefore, the distances between the memory chips of the same memory module and the logic chip are the same, so as to reduce the difference of communication delay between the same memory module and the logic chip.

A logic chip 3 is provided, and the logic chip 3 includes power supply ports 3*a*. The bottom layer of memory module 100 is connected with the logic chip 3 through the solder bumps 51 of the bottom layer of memory module 100, and the first direction X is perpendicular to the upper surface of the logic chip 3.

In the description of the present disclosure, the reference terms "some embodiments", "for example", or the like refer to that specific features, structures, materials, or characteristics described in connection with the embodiment or example are included in at least one embodiment or example of the present disclosure. In this specification, illustrative representations of the above terms do not necessarily refer to the same embodiments or examples. Further, the described specific features, structures, materials or characteristics may be combined in a suitable manner in any one or more embodiments or examples. Further, those skilled in the art may combine different embodiments or examples described in this specification and features of different embodiments or examples without conflicting.

Although embodiments of the present disclosure have been illustrated and described above, it is to be understood that the above-mentioned embodiments are exemplary and cannot be construed as limiting the present disclosure, and those of ordinary skill in the art may make changes, modifications, substitutions and variations to the above-mentioned embodiments within the scope of the present disclosure. Therefore, any changes or modifications made in accordance with the claims and specifications of the present disclosure should fall within the scope of the present disclosure.

The invention claimed is:

1. A semiconductor structure, comprising:
a logic chip having first wireless communication parts; and
a plurality of layers of memory modules stacked on an upper surface of the logic chip in a first direction, the first direction being perpendicular to the upper surface of the logic chip; each memory module comprising a plurality of memory chips stacked in a second direction, the second direction being parallel to the upper surface of the logic chip;
each memory chip in a top layer comprising one second wireless communication part; each memory chip in a non-top layer having two second wireless communication parts arranged in the first direction and a wired communication part connected between the two second wireless communication parts,
wherein two adjacent second wireless communication parts located on different memory chips in the first direction communicate with each other wirelessly; and each first wireless communication part communicates wirelessly with a second wireless communication part, which is closest to the first wireless communication part, in a bottom memory chip;
wherein each memory chip in the non-top layer comprises a solder pad and a solder bump, and each memory chip in the top layer comprises a solder bump; the solder pad is located on a top surface of the memory chip, and the solder bump is located on a bottom surface of the memory chip; for two adjacent memory chips in the first direction, a solder bump of a memory chip of the two adjacent memory chips which is located above is soldered with a solder pad of a memory chip of the two adjacent memory chips which is located below; and solder bumps of memory chips in a bottom layer are soldered with the logic chip.

2. The semiconductor structure of claim 1, wherein a plurality of wired communication parts in a same memory module have a same length.

3. The semiconductor structure of claim 1, wherein the two second wireless communication parts of each memory chip in the non-top layer are defined as a lower communication part and an upper communication part, respectively;
a plurality of lower communication parts in a same memory module are aligned in the second direction;
a plurality of upper communication parts in the same memory module are aligned in the second direction; and
second wireless communication parts in a top layer of memory module are aligned in the second direction.

4. The semiconductor structure of claim 1, wherein the two adjacent second wireless communication parts located on different memory chips in the first direction face each other.

5. The semiconductor structure of claim 1, wherein two second wireless communication parts in a same memory chip face each other in the first direction.

6. The semiconductor structure of claim 1, wherein two second wireless communication parts in each memory chip in the non-top layer are located at an upper edge and a lower edge of the memory chip, respectively.

7. The semiconductor structure of claim 1, wherein the second wireless communication part of each memory chip in the top layer is located at a lower edge of the memory chip.

8. The semiconductor structure of claim 1, wherein the first wireless communication parts are located at an edge of the logic chip towards the memory chips.

9. The semiconductor structure of claim 1, wherein
each memory chip is provided with power supply signal lines; at least one of a plurality of memory chips in a same memory module comprises a power supply wiring layer; each power supply signal line is electrically connected with a power supply wiring layer;
the plurality of layers of memory modules form a plurality of memory cells arranged in the second direction, and each memory cell comprises a plurality of memory chips arranged in the first direction; all memory chips in at least one of the memory cells comprise power supply wiring layers;

a power supply wiring layer of a memory chip in the non-top layer is electrically connected with a respective solder pad and a respective solder bump; a power supply wiring layer of a memory chip in the top layer is electrically connected with a respective solder bump; and the logic chip comprises power supply ports, and solder bumps of memory chips in a bottom layer are connected with the power supply ports.

10. The semiconductor structure of claim 9, wherein the memory modules comprise a plurality of chip groups, each chip group comprising two adjacent memory chips, and the two adjacent memory chips are bonded with each other; and two power supply wiring layers are disposed between two memory chips in a same chip group, and the two power supply wiring layers are located on surfaces of the two memory chips, respectively; each of the two power supply wiring layers is electrically connected with the two memory chips.

11. The semiconductor structure of claim 10, wherein each power supply wiring layer comprises a plurality of power source wirings and a plurality of ground wirings; and power source wirings and ground wirings of a same power supply wiring layer are alternately disposed in a third direction, and the third direction is perpendicular to the first direction and the second direction.

12. The semiconductor structure of claim 9, wherein at least two adjacent memory chips are bonded with each other and form a chip group;

one power supply wiring layer is provided between two adjacent chip groups, and the power supply wiring layer is electrically connected with memory chips of the two chip groups on both sides of the power supply wiring layer; and one power supply wiring layer is provided on each of two sides of each memory module in the second direction, and is electrically connected with a chip group on the respective side of the memory module.

13. The semiconductor structure of claim 9, wherein a width of the power supply wiring layer in the second direction is less than a width of the solder bump in the second direction; and the width of the power supply wiring layer in the second direction is smaller than a width of the solder pad in the second direction.

14. The semiconductor structure of claim 9, wherein a ratio of a height of the solder pad to a height of the memory chip in the first direction ranges from 1:1250 to 1:1350; and a ratio of a height of the solder bump to the height of the memory chip ranges from 1:210 to 1:230.

15. A semiconductor device, comprising:

a substrate;

a logic chip disposed on the substrate and comprising first wireless communication parts; and a plurality of layers of memory modules stacked on an upper surface of the logic chip in a first direction, the first direction being perpendicular to the upper surface of the logic chip; each memory module comprising a plurality of memory chips stacked in a second direction, the second direction being parallel to the upper surface of the logic chip;

each memory chip in a top layer comprising one second wireless communication part; each memory chip in a non-top layer comprising two second wireless communication parts arranged in the first direction and a wired communication part connected between the two second wireless communication parts, wherein two adjacent second wireless communication parts located on different memory chips in the first direction communicate with each other wirelessly; and each first wireless communication part communicates wirelessly with a second wireless communication part, which is closest to the first wireless communication part, in a bottom memory chip;

wherein each memory chip in the non-top layer comprises a solder pad and a solder bump, and each memory chip in the top layer comprises a solder bump; the solder pad is located on a top surface of the memory chip, and the solder bump is located on a bottom surface of the memory chip; for two adjacent memory chips in the first direction, a solder bump of a memory chip of the two adjacent memory chips which is located above is soldered with a solder pad of a memory chip of the two adjacent memory chips which is located below; and solder bumps of memory chips in a bottom layer are soldered with the logic chip.

16. The semiconductor device of claim 15, wherein a plurality of wired communication parts in a same memory module have a same length.

17. The semiconductor device of claim 15, wherein the two second wireless communication parts of each memory chip in the non-top layer are defined as a lower communication part and an upper communication part, respectively;

a plurality of lower communication parts in a same memory module are aligned in the second direction;

a plurality of upper communication parts in the same memory module are aligned in the second direction; and second wireless communication parts in a top layer of memory module are aligned in the second direction.

18. The semiconductor device of claim 15, wherein the two adjacent second wireless communication parts located on different memory chips in the first direction face each other.

19. The semiconductor device of claim 15, wherein two second wireless communication parts in a same memory chip face each other in the first direction.

* * * * *